(12) United States Patent
Dong et al.

(10) Patent No.: US 10,930,869 B2
(45) Date of Patent: Feb. 23, 2021

(54) FLEXIBLE SUBSTRATE AND MANUFACTURE METHOD THEREOF, AND FLEXIBLE ORGANIC LIGHT-EMITTING DIODE DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhongfei Dong, Beijing (CN); Yan Hu, Beijing (CN); Hongguang Yuan, Beijing (CN); Yue Wei, Beijing (CN); Jianxiong Huang, Beijing (CN); Guodong Liu, Beijing (CN); Yimin Dong, Beijing (CN); Yuan Chen, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/396,070

(22) Filed: Apr. 26, 2019

(65) Prior Publication Data
US 2020/0067001 A1 Feb. 27, 2020

(30) Foreign Application Priority Data
Aug. 22, 2018 (CN) .......................... 2018 1 0960912

(51) Int. Cl.
*H01L 29/08* (2006.01)
*H01L 51/00* (2006.01)
*B32B 17/10* (2006.01)
*B32B 27/28* (2006.01)
(Continued)

(52) U.S. Cl.
CPC .... *H01L 51/0097* (2013.01); *B32B 17/10899* (2013.01); *B32B 27/281* (2013.01); *B32B 27/283* (2013.01); *B32B 27/322* (2013.01); *H01L 51/56* (2013.01); *B32B 2307/51* (2013.01); *B32B 2307/702* (2013.01); *B32B 2307/73* (2013.01); *B32B 2310/14* (2013.01); *B32B 2457/206* (2013.01); *H01L 2251/5338* (2013.01)

(58) Field of Classification Search
CPC . H01L 51/56; H01L 51/0545; H01L 51/0562; B32B 17/10899
See application file for complete search history.

(56) References Cited

U.S. PATENT DOCUMENTS

| 2007/0186643 A1* | 8/2007 | Speldrich | .............. G01F 1/6845 |
| | | | 73/204.26 |
| 2011/0062444 A1* | 3/2011 | Park | ..................... H01L 27/1266 |
| | | | 257/59 |

(Continued)

*Primary Examiner* — Phuc T Dang
(74) *Attorney, Agent, or Firm* — Nath, Goldberg & Meyer; Joshua B. Goldberg (57) ABSTRACT

A flexible substrate and a manufacture method thereof, and a flexible organic light-emitting diode display substrate. The flexible substrate comprises a first flexible layer and a second flexible layer stacked with each other and a hydrophobic layer on at least one side of at least one of the first flexible layer and the second flexible layer.

20 Claims, 6 Drawing Sheets

(51) Int. Cl.
*B32B 27/32* (2006.01)
*H01L 51/56* (2006.01)

(56) References Cited

U.S. PATENT DOCUMENTS

| | | | |
|---|---|---|---|
| 2012/0256168 A1* | 10/2012 | Lee | H01L 51/0545 |
| | | | 257/27 |
| 2013/0223191 A1* | 8/2013 | Nakamura | A61B 8/4427 |
| | | | 367/135 |
| 2015/0072124 A1* | 3/2015 | Sakaguchi | H01L 51/0096 |
| | | | 428/216 |
| 2015/0148609 A1* | 5/2015 | Ladet | A61B 1/00137 |
| | | | 600/122 |
| 2018/0119898 A1* | 5/2018 | Fujitani | F21V 5/00 |

* cited by examiner

(a) SiO$_2$
contact angle: 47°

(b) PI substrate
contact angle: 38°

(c) SiO$_2$+OTS
contact angle: 104°

(d) PI+OTS
contact angle: 109°

(e) SiO$_2$+OTMS
contact angle: 92°

(f) PI+OTMS
contact angle: 87°

(12) United States Patent

FLEXIBLE SUBSTRATE AND MANUFACTURE METHOD THEREOF, AND FLEXIBLE ORGANIC LIGHT-EMITTING DIODE DISPLAY SUBSTRATE

TECHNICAL FIELD

The present disclosure belongs to a field of a flexible organic light-emitting diode display technology, particularly relates to a flexible substrate and a manufacture method thereof, and a flexible organic light-emitting diode display substrate.

BACKGROUND

An organic light-emitting diode (OLED) display technology has been widely used because of its fast response, active illumination, low power consumption, and simple structure and so on. Since an organic light-emitting diode device is easily corroded by water vapor (moisture), a side of the organic light-emitting diode display substrate away from the substrate side needs to be packaged, thereby isolating the organic light-emitting diode device from the moisture.

With a development of technology, a flexible organic light-emitting diode (FOLED) display substrate has also been used, and a substrate of the flexible organic light-emitting diode display substrate is a flexible substrate composed of a flexible material. Therefore, the flexible organic light-emitting diode display substrate is deformable as a whole, and a flexible display can be realized.

There is still a need for an improved flexible substrate and a FOLED display substrate using the flexible substrate.

SUMMARY

One aspect of the present disclosure provides a flexible substrate comprising:
a first flexible layer and a second flexible layer stacked with each other, and
a hydrophobic layer disposed on at least one side of at least one of the first flexible layer and the second flexible layer.

Another aspect of the present disclosure provides a method of manufacturing a flexible substrate, comprising the steps of:
providing a first flexible layer and a second flexible layer stacked with each other, and
forming a hydrophobic layer on at least one side of at least one of the first flexible layer and the second flexible layer.

The present disclosure also provides a flexible organic light-emitting diode display substrate comprising:
a flexible substrate comprising a first flexible layer and a second flexible layer stacked with each other, and a hydrophobic layer on at least one side of at least one of the first flexible layer and the second flexible layer, and
a plurality of organic light-emitting diode devices on one side of the flexible substrate.

The present disclosure also provides a flexible organic light-emitting diode display apparatus comprising the above flexible organic light-emitting diode display substrate.

REFERENCE NUMERALS

1, a flexible substrate; 2, a first flexible layer; 3, a second flexible layer; 11, a first polyimide layer; 12, a second polyimide layer; 21, a first silicon oxide layer; 22, a second silicon oxide layer; 3, an amorphous silicon layer; 4, a hydrophobic layer; 41, a head group; 42, a tail group; 49, an active group; 8, a package structure; 9, an organic light-emitting diode device.

DETAILED DESCRIPTION

To enable those skilled in the art better understand the technical solution of the present disclosure, the present disclosure will be further described in detail below in conjunction with the drawings and specific examples.

Compared with a substrate of a hard material such as a conventional glass, a material of a flexible substrate has a weak barrier to moisture, and even if a stacked structure of materials of multiple layers is used, moisture infiltration cannot be effectively prevented. Therefore, although emphasis has been put on a waterproof performance of a package structure of the flexible organic light-emitting diode display substrate, the moisture is still easily infiltrated from the flexible substrate side into the organic light-emitting diode device, thereby affecting service life and reliability of the organic light-emitting diode device.

In order to solve the problem that the existing flexible organic light-emitting diode display substrate has short service life and low reliability, the present disclosure provides a flexible substrate having a long service life and high reliability, a manufacture method thereof, and a flexible organic light-emitting diode display substrate.

Figure 1:
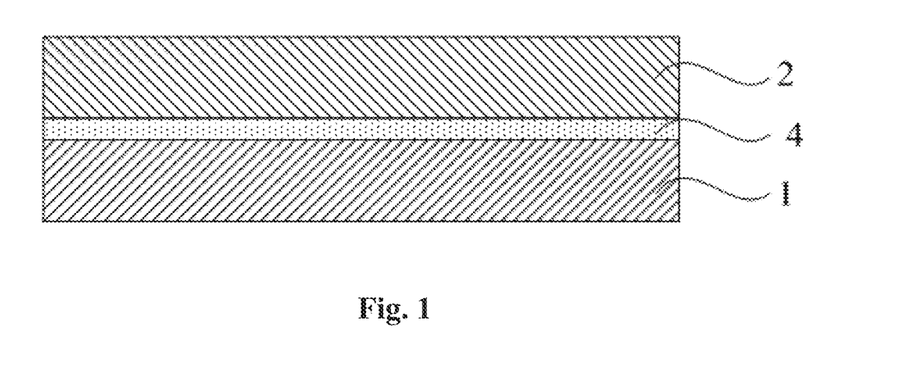
FIG. 1 is a view schematically showing a cross-sectional structure of a flexible substrate of the present disclosure.

Specifically, as shown in FIG. 1, the present disclosure provides a flexible substrate. The flexible substrate comprises a first flexible layer 1 and a second flexible layer 2 stacked with each other. Each of the first flexible layer 1 and the second flexible layer 2 may include at least one of an inorganic layer and an organic layer. The flexible substrate may further include a hydrophobic layer 4. The hydrophobic layer 4 may be disposed on at least one side of the first flexible layer 2 and/or the second flexible layer 3.

Optionally, the hydrophobic layer comprises a monomolecular layer. A molecule of the monomolecular layer comprises a head group and a tail group linked with each other, wherein the head group is attached to a flexible layer and the tail group is a hydrophobic group.

In another example, the hydrophobic layer may be formed of at least one material selected from the group consisting of a polytetrafluoroethylene, a silicone resin, a fluorosilicone resin, or a long-chain polymer.

Optionally, the molecule of the monomolecular layer is a carbon chain molecule, a tail group of the carbon chain molecule is a —C(R)$_n$ group, wherein R is independently a hydrogen, an alkyl group or a silane group, and n is 3.

Optionally, the inorganic layer includes a silicon oxide layer.

Optionally, the organic layer includes a polyimide layer.

Optionally, the flexible substrate comprises a silicon oxide layer and a polyimide layer stacked with each other.

Optionally, the flexible substrate comprises a first polyimide layer, a first silicon oxide layer, an amorphous silicon layer, a second polyimide layer, and a second silicon oxide layer stacked in this order.

Optionally, the hydrophobic layer comprises a first hydrophobic layer and/or a second hydrophobic layer, the first hydrophobic layer may be formed on a side of the second polyimide layer away from the amorphous silicon layer. The second hydrophobic layer may be formed on a side of the second silicon oxide layer away from the amorphous silicon layer.

Figure 2:
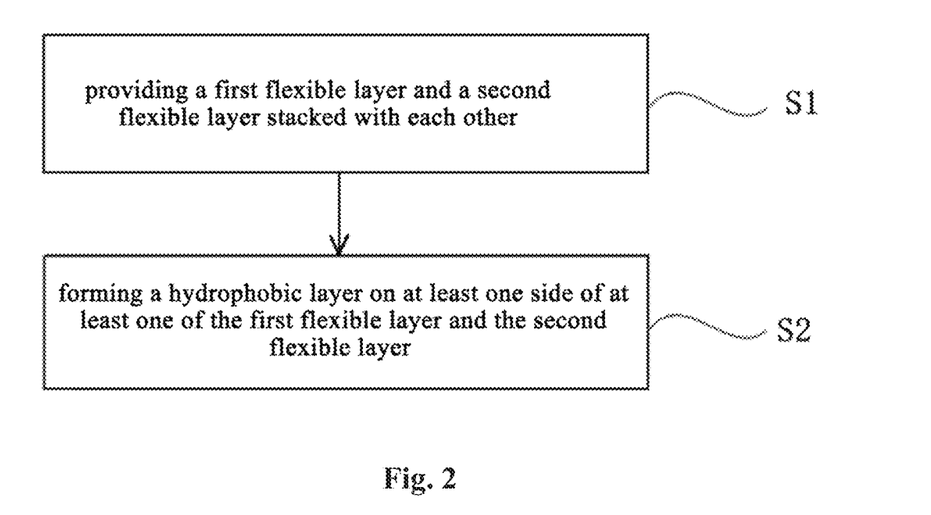
FIG. 2 is a flow chart schematically showing a method of manufacturing a flexible substrate of the present disclosure.

As shown in FIG. 2, the present disclosure provides a method of manufacturing a flexible substrate, comprising the steps of:

S1—providing a first flexible layer and a second flexible layer stacked with each other, and S2—forming a hydrophobic layer on at least one side of at least one of the first flexible layer and the second flexible layer.

Optionally, step S1 may include:

performing plasma bombardment on a surface of the first flexible layer and/or the second flexible layer on which the hydrophobic layer is to be formed, thereby forming an active group on the surface; and evaporating a monomolecular layer raw material such that a vapor of the monomolecular layer raw material reaches the surface having the active group and reacts with the active group to form a monomolecular hydrophobic layer by self-assembly. Optionally, the plasma bombardment is an oxygen plasma bombardment.

Step S1 may alternatively include: providing a target comprising at least one of a polytetrafluoroethylene, a silicone resin, a fluorosilicone resin or a long-chain polymer; and forming the hydrophobic layer on a surface of the first flexible layer and/or the second flexible layer on which a hydrophobic layer is to be formed by evaporation or magnetron sputtering.

Optionally, a raw material for forming a monomolecular layer comprises a compound represented by R$_1$—(Si)-3X, wherein R$_1$ is a substituted or unsubstituted C$_1$-C$_{18}$ hydrocarbon group, and X is a halogen or a C$_1$-C$_4$ alkoxy group, and when R$_1$ is substituted, the substituent is selected from a hydrophobic group.

Optionally, R$_1$ is selected from an octadecyl, an octyl, a decyl or a combination thereof, and X is selected from a chlorine, an ethoxy, a propoxy, a methoxy, a butoxy or a combination thereof.

Optionally, said evaporating a monomolecular layer raw material such that a vapor of the monomolecular layer raw material reaches the surface having the active group comprises: placing the first flexible layer and the second flexible layer with a container containing a monomolecular raw material in a heating chamber, and then performing heating on the heating chamber.

Optionally, a temperature for the heating is between 115° C. and 125° C. and a duration time for the heating is between 115 minutes and 125 minutes.

Figure 3:
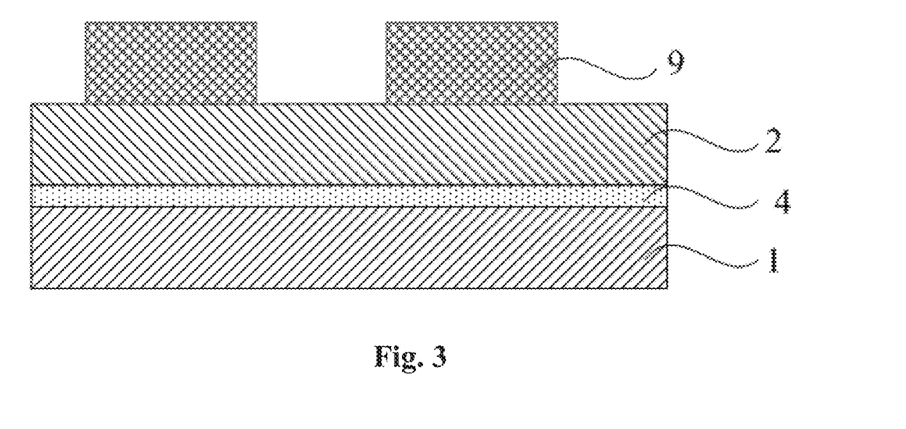
FIG. 3 is a cross-sectional view schematically showing a flexible organic light-emitting diode display substrate of the present disclosure.

As shown in FIG. 3, the present disclosure also provides a flexible organic light-emitting diode display substrate comprising: a flexible substrate and a plurality of organic light-emitting diode devices 9 on one side of the flexible substrate.

Optionally, the flexible substrate comprises a first polyimide layer, a first silicon oxide layer, an amorphous silicon layer, a second polyimide layer, and a second silicon oxide layer stacked in this order; and a plurality of organic light-emitting diode devices 9 are formed on a side of the second silicon oxide layer away from the amorphous silicon layer.

Optionally, a plurality of organic light-emitting diode devices 9 may also be formed on a side of the second silicon oxide layer away from the amorphous silicon layer.

Examples of the present disclosure are further described below in conjunction with FIGS. 4-9, but the present disclosure is in no way limited to these examples.

EXAMPLE 1

As shown in FIGS. 4-9, the present example provides a flexible substrate.

The flexible substrate of the present example can be used as a substrate of a flexible organic light-emitting diode (OLED) display substrate, that is, a display structure such as an organic light-emitting diode (OLED) device 9, a pixel circuit, a lead, or the like is formed on the flexible substrate.

The flexible substrate comprises a first flexible layer and a second flexible layer stacked with each other. Each of the first flexible layer and the second flexible layer comprise at least one of an inorganic layer and an organic layer. A hydrophobic layer 4 is formed on at least one side of at least one of the flexible layers.

Since the flexible substrate is flexible, it necessarily includes a flexible layer, and usually the flexible layer includes at least one of an organic layer composed of an organic material and/or an inorganic layer composed of an inorganic material. One surface of at least one of the flexible layers (which may be an organic layer or an inorganic layer) is provided with a hydrophobic layer 4.

Due to an action of the hydrophobic layer 4, when moisture permeates into the hydrophobic layer 4, it is blocked by the hydrophobic layer 4 (the hydrophobic structure also has a blocking effect on moisture), so that the water-blocking property of the flexible substrate is greatly improved. Therefore, the organic light-emitting diode device 9 can be prevented from being damaged by moisture attacks, thereby prolonging the service life of the flexible organic light-emitting diode display substrate and improving its reliability.

Of course, the above hydrophobic layer 4 does not affect the bonding between the flexible layers and the structure of the display structure and the flexible layers.

Figure 6:
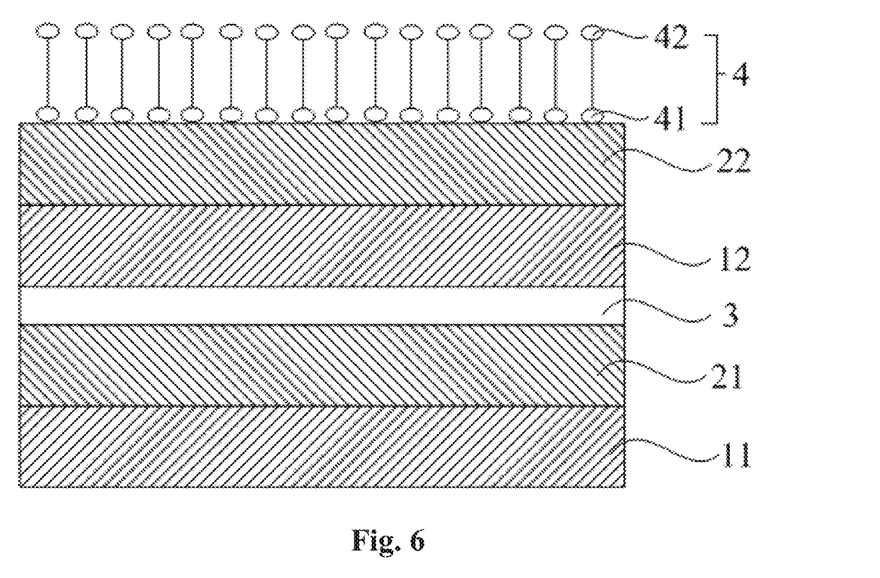
FIG. 6 is a schematic cross-sectional structural view of a flexible substrate having a monomolecular layer according to some examples of the present disclosure.

Optionally, the hydrophobic layer 4 comprises a monomolecular layer, a molecule of the monomolecular layer comprise a head group 41 and a tail group 42 linked with each other, wherein the head group 41 is attached to a flexible layer and the tail group 42 is a hydrophobic group.

That is, as shown in FIG. 6, the hydrophobic layer 4 may be a layer composed of only a single layer of molecules, wherein each of the molecules has a head group 41 and a hydrophobic tail group 42. Since the head group 41 is attached to the flexible layer, the tail group 42 of the molecule is exposed to the outside, and thus the hydrophobic layer 4 can be rendered hydrophobic.

Optionally, a molecule of the monomolecular layer is a carbon chain molecule, and a tail group 42 thereof is a $CH_3$ group.

That is, the monomolecular layer is more optionally a monomolecular carbon chain layer composed of carbon chain molecules, wherein the hydrophobic tail group 42 is a —$CH_3$ group in the carbon chain. Thereby, a relatively regular arrangement of —$CH_3$ groups can be formed on the surface of the hydrophobic layer 4, and thus the surface of the hydrophobic layer 4 has a hydrophobic effect under an action of the —$CH_3$ bond.

Optionally, the inorganic layer comprises a silicon oxide layer; the organic layer comprises a polyimide layer.

Silicon oxide ($SiO_x$ where x ranges from 0 to 2 such as 1, 1.2, 1.5, 1.8 or 2), is generally used as the inorganic layer in the flexible substrate and polyimide (PI) is used as the organic layer.

More optionally, the flexible substrate comprises a silicon oxide layer and a polyimide layer stacked with each other.

That is, the flexible substrate may have both a silicon oxide layer and a polyimide layer, both of which are in contact and stacked with each other. This is because the silicon oxide layer and the polyimide are stacked to provide a better water-blocking effect.

Figure 4:
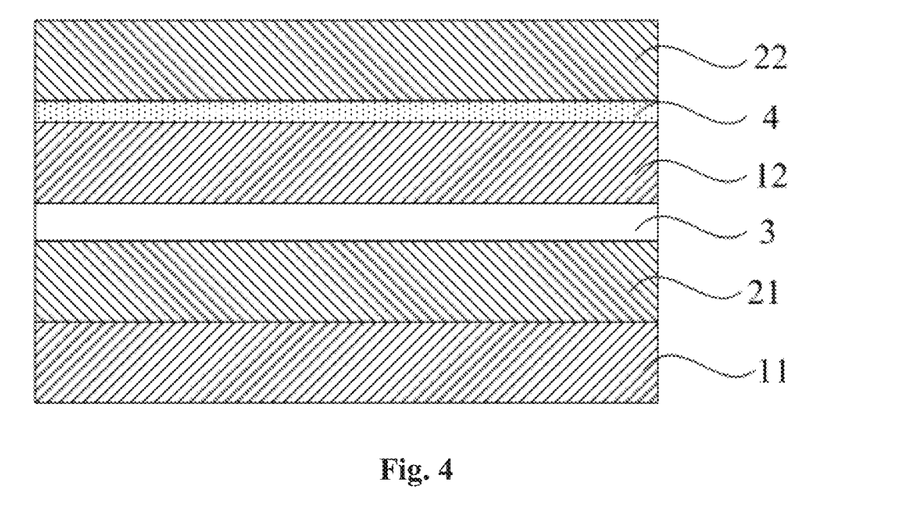
FIG. 4 is a schematic cross-sectional structural view of a flexible substrate according to some examples of the present disclosure.
Figure 5:
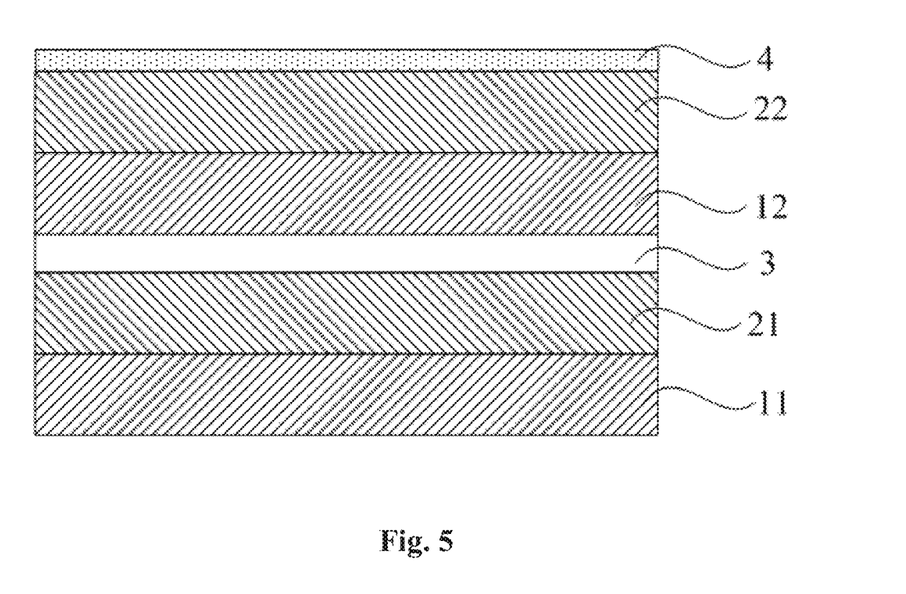
FIG. 5 is a schematic cross-sectional structural view of a flexible substrate according to further examples of the present disclosure.

More optionally, the flexible substrate comprises a first polyimide layer 11, a first silicon oxide layer 21, an amorphous silicon layer 3, a second polyimide layer 12, and a second silicon oxide layer 22 stacked in this order.

That is, as shown in FIGS. 4 and 5, the flexible substrate optionally includes the above five stacked flexible layers. The flexible substrate is usually formed on a substrate of a rigid material such as a glass as an initial step, and then a display structure such as an organic light-emitting diode device 9 is prepared on the flexible substrate, and then the flexible substrate is stripped from the substrate by a laser. The function of the above amorphous silicon (a-Si) layer 3 is mainly to insulate heat during laser-stripping process to prevent damage against the display structure.

Optionally, a hydrophobic layer 4 is formed on a side of the second polyimide layer 12 away from the amorphous silicon layer 3; and/or a hydrophobic layer 4 is formed on a side of the second silicon oxide layer 22 away from the amorphous silicon layer 3.

Figure 9:
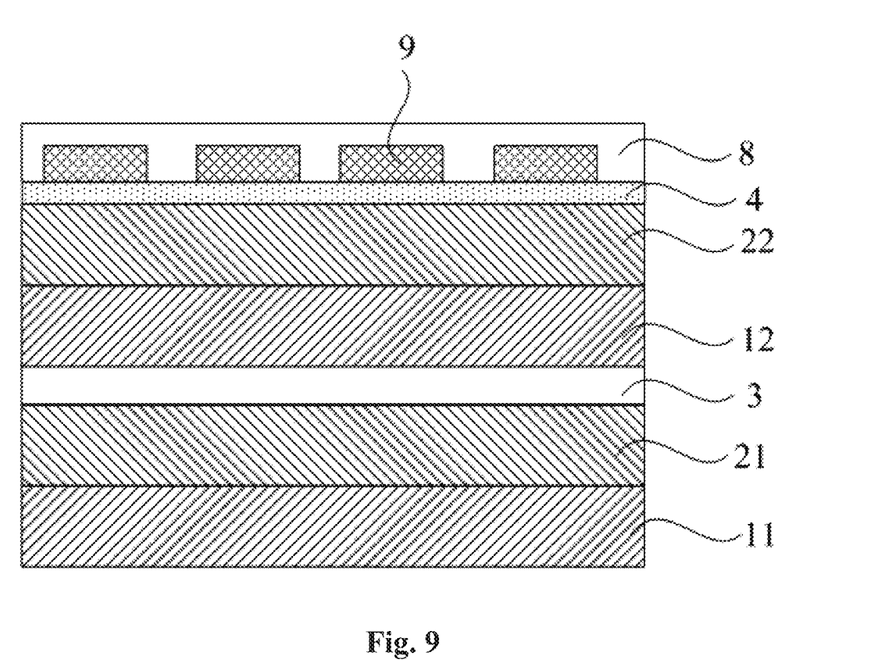
FIG. 9 is a schematic cross-sectional structural view showing a flexible organic light-emitting diode display substrate according to some examples of the present disclosure.

That is, as shown in FIGS. 4 and 5, the above hydrophobic layer 4 is optionally formed on a side of the second polyimide layer 12 or the second silicon oxide layer 22 away from the amorphous silicon layer 3 (upper side in the drawing). This is because, on one hand, the display structure is usually formed on the second silicon oxide layer 22 as shown in FIG. 9, so in the flexible organic light-emitting diode display substrate, the second polyimide layer 12 and the second silicon oxide layer 22 are relatively "interior" layer, the amount of moisture that can penetrate into the second polyimide layer 12 and the second silicon oxide layer 22 is relatively less, and the hydrophobic layer 4 is just used to completely prevent from this small amount of moisture; on the other hand, the flexible substrate is generally prepared in the order of the first polyimide layer 11, the first silicon oxide layer 21, the amorphous silicon layer 3, the second polyimide layer 12, and the second silicon oxide layer 22 layer by layer. Therefore, the above hydrophobic layer 4 can be formed directly on an exposed surface of the second polyimide layer 12 or the second silicon dioxide layer 22, which is convenient in the process.

Of course, it should be understood that the above structure is not a limitation on the possible structure of the flexible substrate. For example, more flexible layers, less flexible layers, and different flexible layers may be included in the flexible substrate. Again for example, the hydrophobic layer 4 may also be formed on other flexible layers; the hydrophobic layer 4 can also be formed on an "outer" surface of a certain flexible layer; or a plurality of hydrophobic layers 4 may also be present in the flexible substrate and the like.

The present example also provides a method of manufacturing a flexible substrate, comprising:

forming a hydrophobic layer 4 on at least one side of the at least one flexible layer.

That is, in the manufacture of the above flexible substrate, the step of forming a hydrophobic layer 4 on the flexible layer is included.

Figure 7:
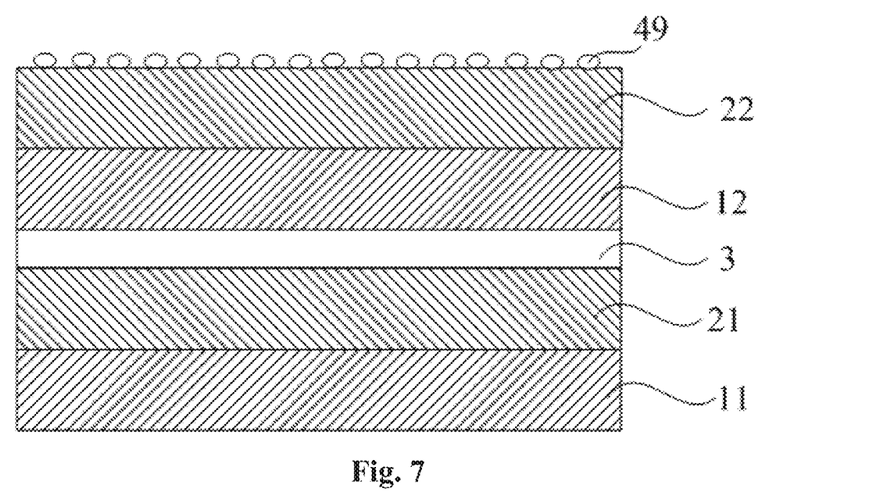
FIG. 7 is a schematic cross-sectional structural view showing flexible substrate after an active group has formed during preparation of a flexible substrate according to some examples of the present disclosure.

Optionally, when the hydrophobic layer 4 is the monomolecular layer as described above, forming the hydrophobic layer 4 on at least one side of the at least one flexible layer comprises:

S01, performing plasma bombardment on a surface of the flexible layer on which the hydrophobic layer 4 is to be formed, thereby forming an active group 49 on the surface.

That is, as shown in FIG. 7, the surface of the flexible layer on which the hydrophobic layer 4 needs to be formed (here, a surface of the second silicon oxide layer 22 away from the amorphous silicon layer 3 is taken as an example) may be firstly subjected to plasma bombardment, thereby leaving a large amount of active groups 49 on the surface, and thus the active group 49 can be bonded to the remaining moiety of the monomolecular layer.

Optionally, the plasma bombardment is an oxygen plasma bombardment.

That is, the above plasma bombardment may an oxygen plasma bombardment, so the corresponding active group 49 is an oxygen-containing active group 49 (such as an —OH group). Specific bombardment parameters (such as energy, etc.) may be set as desired by those skilled in the art as long as sufficient active groups 49 can be formed on the surface.

S02, optionally, placing the flexible layer in a vacuum drying oven for drying.

That is, the flexible layer having the active group 49 (actually a plurality of flexible layers) may be vacuum dried to ensure that the surface of the flexible layer is free of moisture.

S03, evaporating a monomolecular layer raw material such that a vapor of the monomolecular layer raw material reaches the surface of the flexible layer having the active group 49 and reacts with the active group to form a monomolecular layer by self-assembly.

That is, after formation of the above active group 49, the raw material of the monomolecular layer can be evaporated, so that the corresponding molecule is brought into contact with the active group 49, and reacts with the active group 49, thereby self-assembling to form the monomolecular layer as shown in FIG. 6.

Optionally, the step is specifically as follows: placing the flexible layers and a container containing a monomolecular layer raw material in a heating chamber, and then performing heating on the heating chamber. More optionally, a temperature for the heating is between 115° C. and 125° C. and a duration time for the heating is between 115 minutes and 125 minutes (eg, at 120° C. for 2 hours).

That is, this step may specifically be as follows: placing the flexible layers and the monomolecular layer raw material into a chamber simultaneously, and performing heating on the heating chamber. Thereby, the monomolecular layer raw material is evaporated, and the evaporated molecules are brought into contact with the active group 49 and self-assembled.

Figure 8:
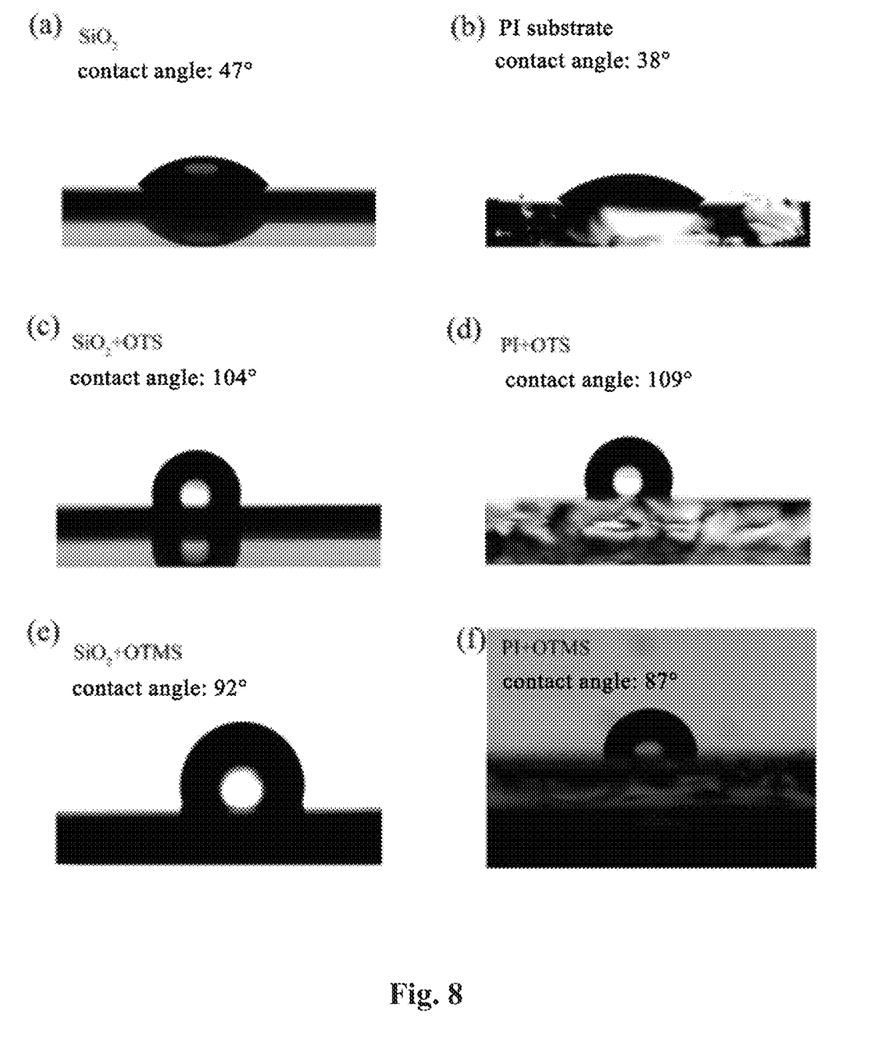
FIG. 8 is a schematic view showing a hydrophobic property of a hydrophobic layer in a flexible substrate according to some examples of the present disclosure.

Optionally, when the molecule of the monomolecular layer is the above carbon chain molecule, the monomolecular layer raw material is a compound represented by $R_1$—(Si)-3X, wherein $R_1$ is a substituted or unsubstituted $C_1$-$C_{18}$ hydrocarbon group, and X is a halogen or a $C_1$-$C_4$ alkoxy group, and in a case that $R_1$ is substituted, the substituent is selected from a hydrophobic group. For example, the raw material includes octadecyltrichlorosilane (OTS) and/or octyltriethoxysilane (OTMS).

That is, the above monomolecular layer (the hydrophobic layer 4) may be prepared using OTS or OTMS as the raw material. The hydrophobic properties of the hydrophobic layer 4 formed on the polyimide layer or the silicon oxide layer by using OTS and OTMS respectively are as shown in FIG. 8. It can be seen that regardless of which hydrophobic layer 4 is formed on either of the flexible layer, the contact angle of the water droplets can be greatly increased, which indicates that they can achieve a good hydrophobic effect.

S04, cooling the flexible layers naturally and then washing the flexible layers to obtain a flexible substrate product.

Alternatively, forming the hydrophobic layer 4 on at least one side of the at least one flexible layers may further comprise: providing a target comprising at least one of a polytetrafluoroethylene, a silicone resin, a fluorosilicone resin or a long-chain polymer; and forming the hydrophobic layer on a surface of the flexible layers on which a hydrophobic layer is to be formed by evaporation or magnetron sputtering.

Of course, if other flexible layers need to be formed after this step, the corresponding process steps may be added; and before the step S01, the step of forming one or more flexible layers may also be included.

EXAMPLE 2

As shown in FIG. 4 to FIG. 9, the example provides a flexible organic light-emitting diode (FOLED) display substrate, which includes:

a flexible substrate as described above, and a plurality of organic light-emitting diode devices 9 on one side of the flexible substrate.

That is, the above flexible substrate may be used as a substrate on which a plurality of organic light-emitting diode (OLEO) devices 9 are formed as sub-pixels, thereby obtaining a flexible organic light-emitting diode display substrate.

Of course, in the flexible organic light-emitting diode display substrate, in addition to the organic light-emitting diode device 9, other known structures such as a pixel circuit, a gate line, a data line, and a package structure 8 may be formed, which will not be described in detail herein.

Optionally, for the above flexible substrate having five flexible layers; a plurality of organic light-emitting diode devices 9 are formed on a side of the second silicon oxide layer 22 away from the amorphous silicon layer 3.

That is, as shown in FIG. 9, when the flexible substrate employs the above five-layer structure, the organic light-emitting diode device 9 or the like is optionally formed on the second silicon oxide layer 22.

Obviously, the flexible organic light-emitting diode display substrate may be combined with other devices to form a flexible organic light-emitting diode display device having a complete display function. Specifically, the flexible organic light-emitting diode display device can be any product having a display function such as an organic light-emitting diode display panel, an electronic paper, a mobile phone, a television, a display, a notebook computer, a digital photo frame, a navigator, and the like.

It is to be understood that the above examples are merely exemplary examples employed to explain the principles of the present disclosure, but the present disclosure is not limited thereto. Various modifications and improvements can be made by those skilled in the art without departing from the spirit and scope of the disclosure, and such modifications and improvements are also considered to be within the scope of the disclosure.

The invention claimed is:

1. A flexible substrate comprising:
   a first flexible layer and a second flexible layer stacked with each other, and
   a hydrophobic layer on at least one side of at least one of the first flexible layer and the second flexible layer, wherein
   the hydrophobic layer comprises a monomolecular layer, a molecule of the monomolecular layer comprise a head group and a tail group linked to each other, wherein the head group is attached to a flexible layer and the tail group is a hydrophobic group.

2. The flexible substrate according to claim 1, wherein the molecule of the monomolecular layer is a carbon chain molecule, a tail group of the carbon chain molecule is a —$C(R)_n$ group, wherein R is independently a hydrogen, an alkyl group and a silane group, and n is 3.

3. The flexible substrate according to claim 1, wherein each of the first flexible layer and the second flexible layer comprise at least one of an inorganic layer and an organic layer, and the inorganic layer comprises a silicon oxide layer.

4. The flexible substrate according to claim 1, wherein each of the first flexible layer and the second flexible layer comprise at least one of an inorganic layer and an organic layer, and the organic layer includes a polyimide layer.

5. The flexible substrate according to claim 1, wherein the flexible substrate comprises a silicon oxide layer and a polyimide layer that are stacked.

6. The flexible substrate according to claim 5, wherein the flexible substrate comprises a first polyimide layer, a first silicon oxide layer, an amorphous silicon layer, a second polyimide layer, and a second silicon oxide layer stacked in this order.

7. The flexible substrate according to claim 6, wherein the hydrophobic layer comprises a first hydrophobic layer and a second hydrophobic layer, the first hydrophobic layer being formed on a side of the second polyimide layer away from the amorphous silicon layer; and the second hydrophobic layer is formed on a side of the second silicon oxide layer away from the amorphous silicon layer.

8. A flexible substrate comprising:
   a first flexible layer and a second flexible layer stacked with each other, and
   a hydrophobic layer on at least one side of at least one of the first flexible layer and the second flexible layer, wherein the hydrophobic layer is formed of at least one material selected from the group consisting of a polytetrafluoroethylene, a silicone resin, a fluorosilicone resin, or a long-chain polymer.

9. A method of manufacturing a flexible substrate, comprising the steps of:
providing a first flexible layer and a second flexible layer stacked with each other, and
forming a hydrophobic layer on at least one side of at least one of the first flexible layer and the second flexible layer,
the hydrophobic layer comprises a monomolecular layer, a molecule of the monomolecular layer comprise a head group and a tail group linked to each other, wherein the head group is attached to a flexible layer and the tail group is a hydrophobic group.

10. The method of manufacturing a flexible substrate according to claim 9, wherein the forming a hydrophobic layer on at least one side of at least one of the first flexible layer and the second flexible layer comprises:
performing plasma bombardment on a surface of at least one of the first flexible layer and the second flexible layer on which the hydrophobic layer is to be formed, thereby forming an active group on the surface;
evaporating a monomolecular layer raw material such that a vapor of the monomolecular layer raw material reaches the surface having the active group and reacts with the active group to form a monomolecular hydrophobic layer by self-assembly.

11. The method of manufacturing a flexible substrate according to claim 10, wherein
the monomolecular layer raw material comprises a compound represented by R1-(Si)-3X, wherein R1 is a substituted or unsubstituted C1-C18 hydrocarbon group, and X is a halogen or a C1-C4 alkoxy group, and when R1 is substituted, the substituent is selected from a hydrophobic group.

12. The method of manufacturing a flexible substrate according to claim 11, wherein R1 is selected from an octadecyl, an octyl, a decyl or a combination thereof, and X is selected from a chlorine, an ethoxy, a propoxy, a methoxy, a butoxy or a combination thereof.

13. The method of manufacturing a flexible substrate according to claim 10, wherein
the plasma bombardment is an oxygen plasma bombardment.

14. The method of manufacturing a flexible substrate according to claim 10, wherein the evaporating a monomolecular layer raw material such that a vapor of the monomolecular layer raw material reaches the surface having the active group comprises:
placing the first flexible layer and the second flexible layer with a container containing a monomolecular raw material in a heating chamber, and then performing heating on the heating chamber.

15. The method of manufacturing a flexible substrate according to claim 14, wherein
a temperature for the heating is between 115° C. and 125° C. and a duration time for the heating is between 115 minutes and 125 minutes.

16. A method of manufacturing a flexible substrate, comprising the steps of:
providing a first flexible layer and a second flexible layer stacked with each other, and
forming a hydrophobic layer on at least one side of at least one of the first flexible layer and the second flexible layer,
wherein the forming a hydrophobic layer on at least one side of at least one of the first flexible layer and the second flexible layer comprises:
providing a target comprising at least one of a polytetrafluoroethylene, a silicone resin, a fluorosilicone resin and a long-chain polymer; and
forming the hydrophobic layer on a surface of at least one of the first flexible layer and the second flexible layer on which a hydrophobic layer is to be formed by evaporation or magnetron sputtering.

17. A flexible organic light-emitting diode display substrate comprising:
a flexible substrate comprising a first flexible layer and a second flexible layer stacked with each other, and a hydrophobic layer on at least one side of at least one of the first flexible layer and the second flexible layer, and
a plurality of organic light-emitting diode devices on one side of the flexible substrate,
wherein
the hydrophobic layer comprises a monomolecular layer, a molecule of the monomolecular layer comprise a head group and a tail group linked to each other, wherein the head group is attached to a flexible layer and the tail group is a hydrophobic group.

18. The flexible organic light-emitting diode display substrate according to claim 17, wherein
the flexible substrate comprises a first polyimide layer, a first silicon oxide layer, an amorphous silicon layer, a second polyimide layer, and a second silicon oxide layer stacked in this order; and
the plurality of organic light-emitting diode devices are formed on a side of the second silicon oxide layer away from the amorphous silicon layer.

19. The flexible organic light-emitting diode display substrate according to claim 18, wherein
the hydrophobic layer comprises a first hydrophobic layer and a second hydrophobic layer, the first hydrophobic layer being formed on a side of the second polyimide layer away from the amorphous silicon layer; and the second hydrophobic layer is formed on a side of the second silicon oxide layer away from the amorphous silicon layer.

20. A flexible organic light-emitting diode display substrate comprising:
a flexible substrate comprising a first flexible layer and a second flexible layer stacked with each other, and a hydrophobic layer on at least one side of at least one of the first flexible layer and the second flexible layer, and
a plurality of organic light-emitting diode devices on one side of the flexible substrate,
wherein
the hydrophobic layer is formed of at least one material selected from the group consisting of a polytetrafluoroethylene, a silicone resin, a fluorosilicone resin, or a long-chain polymer.

* * * * *